United States Patent
Huang et al.

(10) Patent No.: US 9,576,830 B2
(45) Date of Patent: Feb. 21, 2017

(54) METHOD AND APPARATUS FOR ADJUSTING WAFER WARPAGE

(75) Inventors: Hui-Min Huang, Taoyuan (TW); Chih-Wei Lin, Xinfeng Township (TW); Wen-Hsiung Lu, Jhonghe (TW); Ming-Da Cheng, Jhubei (TW); Chung-Shi Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 877 days.

(21) Appl. No.: 13/475,790

(22) Filed: May 18, 2012

(65) Prior Publication Data

US 2013/0309621 A1    Nov. 21, 2013

(51) Int. Cl.
H01L 21/687    (2006.01)
H01L 21/67    (2006.01)
H01L 21/683    (2006.01)

(52) U.S. Cl.
CPC ..... *H01L 21/67288* (2013.01); *H01L 21/6838* (2013.01)

(58) Field of Classification Search
CPC ........... H01L 21/6838; H01L 21/67288; H01L 21/3511
USPC ........................................................ 118/725
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,413,321 B1* | 7/2002 | Kim et al. ..................... 118/725 |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |

(Continued)

*Primary Examiner* — Steven B McAllister
*Assistant Examiner* — Ko-Wei Lin
(74) *Attorney, Agent, or Firm* — Hauptman Ham, LLP

(57) ABSTRACT

A method for adjusting the warpage of a wafer, includes providing a wafer having a center portion and edge portions and providing a holding table having a holding area thereon for holding the wafer. The wafer is placed onto the holding table with the center portion higher than the edge portions and thereafter pressed onto the holding area such that the wafer is attracted to and held onto the holding table by self-suction force. The wafer is heated at a predetermined temperature and for a predetermined time in accordance with an amount of warpage of the wafer in order to achieve a substantially flat wafer or a predetermined wafer level.

21 Claims, 4 Drawing Sheets

(56) References Cited

U.S. PATENT DOCUMENTS

| | | |
|---|---|---|
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2002/0023590 A1 | 2/2002 | Storbeck |
| 2006/0291835 A1* | 12/2006 | Nozaki ............ H01L 21/68735 392/416 |
| 2009/0269490 A1* | 10/2009 | Moriyama et al. ........... 427/240 |
| 2011/0237050 A1* | 9/2011 | Sugimura et al. ............ 438/465 |
| 2011/0263133 A1* | 10/2011 | Hara ................ H01L 21/67028 438/758 |

* cited by examiner

METHOD AND APPARATUS FOR ADJUSTING WAFER WARPAGE

BACKGROUND

Composite wafers are used in the manufacture of advanced technology semiconductor devices, such as three-dimensional integrated circuits (3D ICs). Wafer warpage is a factor that affects the manufacture yield.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
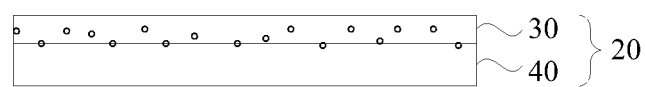
FIG. 1 is a cross-sectional view of a composite wafer according to various embodiments of the present disclosure.

FIG. 1 is a cross-sectional view of a composite wafer 20 according to some embodiments. Composite wafer 20 comprises a polymer layer 30 formed over a silicon substrate 40. In the manufacture of composite wafer 20 and/or during subsequent processes, composite wafer 20 may be subject to high temperatures (e.g., 1000-1100 Celsius).

Figure 2:
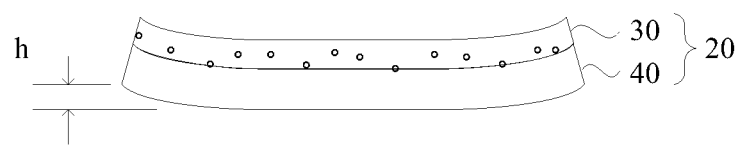
FIG. 2 is a cross-sectional view of the composite wafer of FIG. 1 having warpage.

As shown in FIG. 2, when composite wafer 20 cools to a lower temperature, such as room temperature, warpage may be generated therein, the wafer having a warpage, h (e.g., 0.5 mm-1 mm). This warpage may be caused by a difference in the coefficients of thermal expansion (CTEs) between the silicon substrate 40, which may have a CTE of 4, and polymer layer 30, which may have a CTE higher than 4. Warpage or wafer flatness is a consideration, because subsequent processes, such as photolithography, may be highly sensitive to flatness and a wafer that is not substantially flat complicates subsequent device fabrication and test processes which may adversely affect the manufacture yield.

Figure 3:
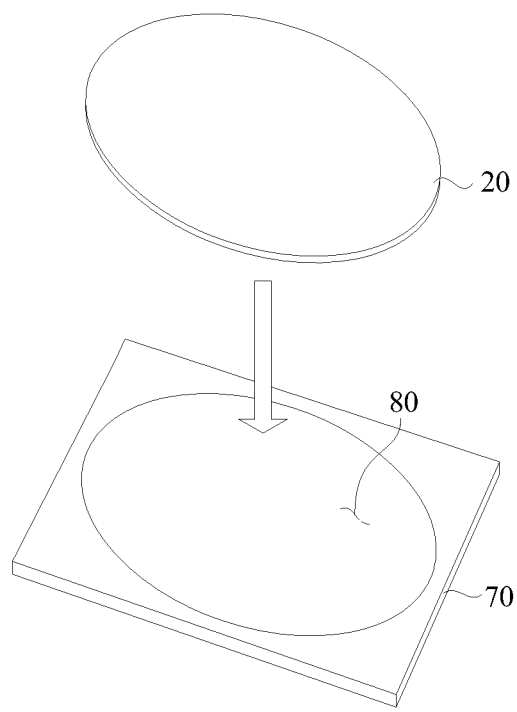
FIG. 3 is a perspective view of a holding table for holding a wafer pressed thereonto for flattening the wafer, according to various embodiments of the present disclosure.

FIG. 3 shows a holding table 70 for holding a wafer 20 thereonto for flattening wafer 20, according to various embodiments of the present disclosure. Wafer 20 may be a single substrate wafer such as a silicon substrate wafer or a composite wafer having a polymer layer formed on the silicon substrate. One or more embodiments are not limited to the use of a polymer based composite wafer, as other materials may be used in the composite wafer.

Figure 4:
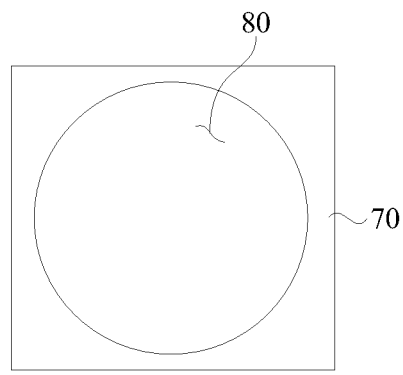
FIG. 4 is a top view of the holding table of FIG. 3, according to various embodiments of the present disclosure.
Figure 5:
FIG. 5 is a cross-sectional view of the holding table of FIG. 3, according to various embodiments of the present disclosure.

FIG. 4 is a top view of the holding table 70 and FIG. 5 is a cross-sectional view of the holding table, according to various embodiments of the present disclosure. Holding table 70 may comprise a one piece structure or a multi-piece structure and may be made of a metal, such as aluminum, copper, steel or the like or a non-porous material, such as ceramic. Holding table 70 may have a square or rectangular shape. The above-listed configurations are merely examples, and there are various alternative applicable configurations in some embodiments.

Holding table 70 is formed such that it can be heated, as a whole, to a predetermined temperature by a heater which is not shown for the sake of simplicity. In some embodiments, for example, the holding table 70 is provided with an electronic heater, and can be cooled as well as heated. The heated holding table 70 can then heat wafer 20.

Holding table 70 has a holding area 80 thereon. Holding area 80 has a generally concave profile and a smooth surface, and is configured to produce a suction force (air pressure difference) to hold the wafer to the holding table when a wafer is placed on and then pressed onto the holding area 80. The holding area 80 comprises different concave profiles that are adapted for use on wafers having different warpage profiles. In other words, the holding area 80 has predetermined concave profile adapted for use on a wafer having a predetermined warpage profile for decreasing a corresponding amount of warpage in the wafer to achieve a substantially flat wafer, according to embodiments of the present disclosure. According to embodiments of the present disclosure, a number of holding tables 70, each having a different warpage profile may be manufactured to accommodate the myriad of wafers having different degrees of warpage or wafer levels.

Figure 6:
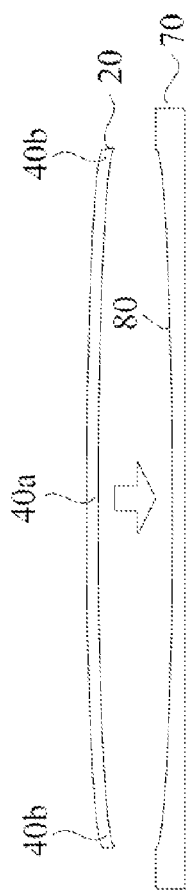
FIG. 6 is a schematic side view of a wafer with warpage being placed onto the holding table, according to various embodiments of the present disclosure.
Figure 7:
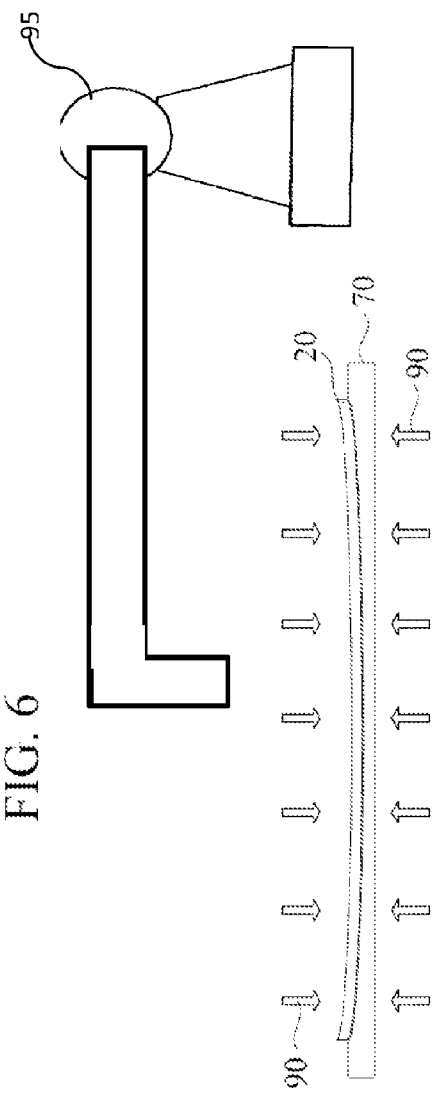
FIG. 7 is a schematic side view of the wafer pressed onto the holding table and held thereto, according to various embodiments of the present disclosure.

FIG. 6 shows an operation of placing the wafer onto the holding table, the wafer having a center portion 40a and edge portions 40b. According to one embodiment, the wafer is placed onto the holding table 70 with the center portion 40a higher than the edge portions 40b. As shown in FIG. 7, wafer 20 is then pressed onto the holding area 80. This allows wafer 20 to be attracted to and held onto the holding table 70 by way of a self suction force or, in other words, a downward force that is applied to the wafer due to the air pressure difference between the pressure at the top of the wafer 40 and the pressure between the holding table 70 and wafer 20. Air between wafer 20 and the smooth surface of the holding area 80 is purged, in some embodiments, in order to obtain a good suction force. When wafer 20 is pressed, wafer 20 will have a slight concave profile, matching the concave profile of the holding area 80. In one embodiment, wafer 20 is pressed onto the holding area manually, such as by a technician. In another embodiment, the wafer 20 is pressed onto the holding area automatically, such as by a robotic arm 95. In some embodiments, the wafer 20 is attracted to and held onto the holding table 70 by self-suction force, without using other forces or additional structures. In some embodiments, the wafer 20 is attracted to and held onto the holding table 70 by a pressure difference between both sides of the wafer 20, without using other forces or additional structures.

Figure 8:
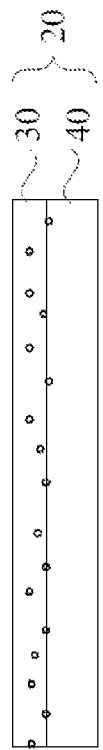
FIG. 8 is a schematic side view of a flattened composite wafer, according to various embodiments of the present disclosure.

After wafer 20 is pressed and held onto holding table 70, warpage of wafer 20 is remedied by heating, schematically indicated at 90 in FIG. 7, wafer 20 by means of the heater in the holding table 70, in some embodiments, and/or by an external heater, in further embodiments. The external heater source may comprise a ultra-violet (UV), infrared radiation (IR), or microwave device or the like. The result is that the amount of warpage of wafer 20 gradually decreases. Wafer 20 is heated at a predetermined temperature and for a predetermined time in accordance with an amount of warpage of the wafer in order to achieve a substantially flat wafer, which is depicted in FIG. 8. In another exemplary embodiment, wafer 20 is heated at a predetermined temperature and for a predetermined time in accordance with an amount of warpage of the wafer in order to achieve a predetermined wafer level. The temperature the wafer 20 is heated at will depend on the warpage profile of the wafer as well as the composite volume ratio in the composite wafer. According to one embodiment, the predetermined temperature has a range from about 30 degrees Celsius to about 300 degrees Celsius and the predetermined time is from about 1 second to about 7,200 seconds. According to another embodiment where composite wafer 20 comprises a polymer layer on a silicon substrate, the predetermined temperature has a range from about 90 degrees Celsius to about 200 degrees Celsius and the predetermined time is from about 1 second to about 3,600 seconds. The wafer 20 is then cooled to a lower temperature, such as room temperature. The method of cooling is not limited, but it is recommended to use an electronic cooling device in some embodiments. In some embodiments, the temperature and time for heating/holding the wafer are predetermined, e.g., by performing experiments on multiple wafers having various degrees or profiles of warpage, determining the optimal temperature and time for each profile, storing the optimal temperature and time in a look up table to be accessed when an actual wafer is to be flattened.

If the amount of warpage h of the composite wafer is relatively large, for example from between about 1 mm to about 2 mm, before the operation of placing wafer 20 onto the holding table 70, wafer 20 may be heated to be softened. According to one embodiment, wafer 20 may be heated up to soften the composite material in the wafer at a temperature at or above the glass transition temperature ($T_g$) of the composite material. According to another embodiment, the wafer may be heated up to soften the polymer layer at a temperature at or above the glass transition temperature ($T_g$) of polymer.

Figure 9:
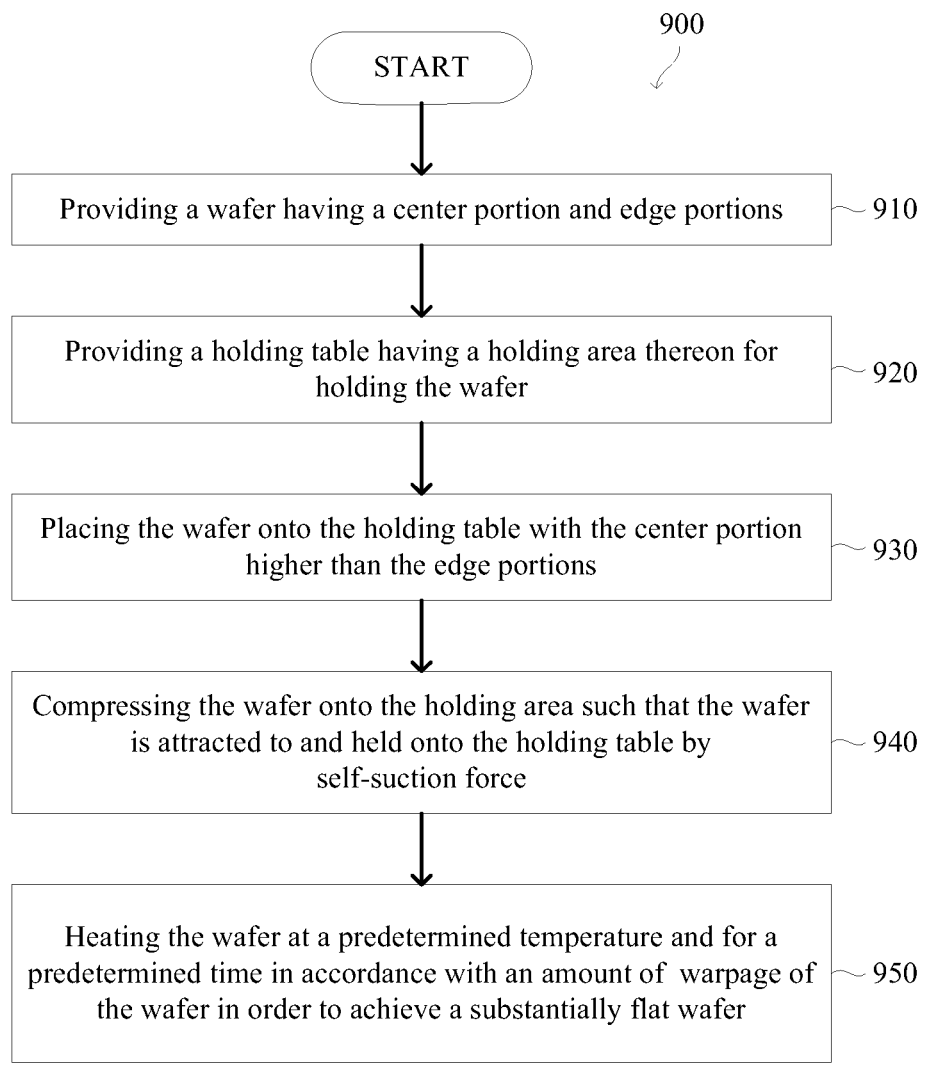
FIG. 9 is a flowchart of a method of adjusting warpage of a wafer, according to various embodiments of the present disclosure.

Illustrated in FIG. 9 is a flowchart of a method 900 for adjusting the warpage of a wafer, according to various embodiments of the present disclosure. Referring to FIG. 9, the method includes operation 910, in which a wafer is provided having a center portion and edge portions. In operation 920, a holding table is provided having a holding area thereon for holding the wafer. In operation 930, the wafer is placed onto the holding table with the center portion higher than the edge portions. The method 900 further includes operation 940, in which the wafer is pressed onto the holding area such that the wafer is attached to and held onto the holding table by way of attraction means. In operation 950, the wafer is heated at a predetermined temperature and for a predetermined time in accordance with an amount of warpage of the wafer in order to achieve a substantially flat wafer. In another exemplary embodiment, the wafer can be heated at a predetermined temperature and for a predetermined time in accordance with an amount of warpage of the wafer in order to achieve a predetermined wafer level.

It is understood that additional processes may be performed before, during, or after the operations 910-950 shown in FIG. 9 to complete the composite wafer flattening process, but these additional processes are not discussed herein in detail for the sake of simplicity.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of adjusting warpage of a wafer, the method comprising:
   providing a wafer having a center portion and edge portions;
   providing a holding table having a holding area thereon for holding the wafer;
   placing the wafer onto the holding table with the center portion higher than the edge portions;
   pressing the wafer onto the holding area by contacting the wafer on a side of the wafer opposite the holding area such that air between the wafer and the holding table is purged by the pressing to create a self-suction force; and
   heating the wafer at a predetermined temperature and for a predetermined time in accordance with an amount of warpage of the wafer.

2. The method of claim 1, wherein the wafer is a composite wafer.

3. The method of claim 2, wherein the composite wafer comprises a silicon substrate and a polymer layer disposed thereon.

4. The method of claim 3, further comprising, before placing the wafer onto the holding table, heating the wafer to soften the polymer layer at a temperature at or above the glass transition temperature (Tg) of polymer.

5. The method of claim 1, wherein the holding area of the holding table has a concave profile.

6. The method of claim 5, wherein the holding area has a predetermined concave profile adapted for use on a wafer having a predetermined warpage profile for decreasing a corresponding amount of warpage in the wafer to achieve a substantially flat wafer or a predetermined wafer level.

7. The method of claim 1, wherein the wafer is held onto the holding table by the self-suction force, without using other forces or additional structures.

8. The method of claim 1, wherein the predetermined temperature is from about 30 degrees Celsius to about 300 degrees Celsius and the predetermined time is from about 1 second to about 7,200 seconds.

9. The method of claim 1, further comprising, before placing the wafer onto the holding table, heating the wafer to soften the wafer.

10. A method of adjusting warpage of a composite wafer, the method comprising:
    placing a composite wafer having a convex profile onto a holding table having a concave-shaped holding area, with the convex profile of the wafer oriented upward, wherein the holding table is free of openings;
    pressing the wafer onto the holding area by contacting the wafer on a side of the wafer opposite the holding area until the wafer has a concave profile and air between the wafer and the holding table is purged by the pressing to create self-suction force;
    heating the wafer at a predetermined temperature and for a predetermined time in accordance with an amount of warpage of the wafer; and
    cooling the wafer.

11. The method of claim 10, wherein the wafer is held onto the holding table by the self-suction force, without using other forces or additional structures.

12. The method of claim 10, wherein the composite wafer comprises a silicon substrate and a polymer layer disposed thereon.

13. The method of claim 10, further comprising, before placing the composite wafer onto the holding table, heating the composite wafer to soften the polymer layer at a temperature at or above the glass transition temperature (Tg) of polymer.

14. The method of claim 10, wherein the predetermined temperature is from about 30 degrees Celsius to about 300 degrees Celsius and the predetermined time is from about 1 second to about 7,200 seconds.

15. A method of adjusting warpage of a wafer, the method comprising:
    providing a wafer having a center portion and edge portions;
    providing a holding table having a holding area thereon for holding the wafer;
    placing the wafer onto the holding table with the center portion higher than the edge portions, wherein a surface of the holding table facing the wafer is uninterrupted by openings;
    pressing the wafer onto the holding area by contacting the wafer on a side of the wafer opposite the holding area such that air between the wafer and the holding table is purged by the pressing to create a pressure difference between opposite sides of the wafer; and
    heating the wafer held onto the holding table at a predetermined temperature and for a predetermined time in accordance with an amount of warpage of the wafer.

16. A method of adjusting warpage of a wafer, the method comprising:
    placing a composite wafer having a first wafer profile onto a holding table, the holding table having a holding area, the holding area having a predetermined surface profile;
    pressing the composite wafer onto the holding area by contacting the composite wafer on a side of the composite wafer opposite the holding area, such that air between the composite wafer and the holding table is purged by the pressing to create a self-suction force resulting from a difference between the first wafer profile and the predetermined surface profile;
    heating the composite wafer at a predetermined temperature and for a predetermined time; and
    cooling the composite wafer to a room temperature.

17. The method of claim 16, wherein the predetermined surface profile is a concave profile.

18. The method of claim 16, wherein heating the composite wafer at the predetermined temperature and for the predetermined time comprises setting the predetermined temperature ranging from 30 degrees Celsius to 300 degrees Celsius and the predetermined time ranging from 1 second to 7,200 seconds.

19. The method of claim 16, wherein heating the composite wafer comprises using an external heater source, wherein the external heater source comprises an ultra-violet (UV) device, an infrared radiation (IR) device, or a microwave device.

20. The method of claim 1, wherein placing the wafer onto the holding table comprises placing the wafer onto a smooth surface of the holding table.

21. The method of claim 10, wherein pressing the wafer comprises pressing the wafer using a robotic arm.

* * * * *